(12) United States Patent
Nishihata et al.

(10) Patent No.: US 8,003,494 B2
(45) Date of Patent: Aug. 23, 2011

(54) METHOD FOR PRODUCING A BONDED WAFER

(75) Inventors: Hideki Nishihata, Minato-ku (JP); Nobuyuki Morimoto, Minato-ku (JP); Tatsumi Kusaba, Minato-ku (JP); Akihiko Endo, Minato-ku (JP)

(73) Assignee: SUMCO Corporation, Minato-ku (JP)

( * ) Notice: Subject to any disclaimer, the term of this patent is extended or adjusted under 35 U.S.C. 154(b) by 0 days.

(21) Appl. No.: 12/676,874

(22) PCT Filed: Aug. 6, 2008

(86) PCT No.: PCT/JP2008/064505
§ 371 (c)(1),
(2), (4) Date: Mar. 5, 2010

(87) PCT Pub. No.: WO2009/031392
PCT Pub. Date: Mar. 12, 2009

(65) Prior Publication Data
US 2010/0248447 A1    Sep. 30, 2010

(30) Foreign Application Priority Data
Sep. 7, 2007  (JP) .................................. 2007-232818

(51) Int. Cl.
*H01L 21/46* (2006.01)
(52) U.S. Cl. . 438/459; 438/474; 438/663; 438/E21.214; 438/E21.237
(58) Field of Classification Search .......................... None
See application file for complete search history.

(56) References Cited

U.S. PATENT DOCUMENTS

| 5,849,627 | A  | * | 12/1998 | Linn et al. .................... 438/455 |
| 6,653,209 | B1 | * | 11/2003 | Yamagata ..................... 438/459 |
| 7,276,430 | B2 | * | 10/2007 | Kwon ........................... 438/459 |
| 7,867,877 | B2 | * | 1/2011  | Morita et al. ................. 438/459 |
| 7,951,692 | B2 | * | 5/2011  | Murakami et al. ............ 438/473 |
| 2003/0087503 | A1 | * | 5/2003 | Sakaguchi et al. ............ 438/406 |
| 2005/0217560 | A1 |   | 10/2005 | Tolchinsky |
| 2007/0117281 | A1 |   | 5/2007  | Endo |
| 2007/0161199 | A1 | * | 7/2007  | Morita ......................... 438/311 |

(Continued)

FOREIGN PATENT DOCUMENTS

JP             2-1914 A      1/1990

(Continued)

OTHER PUBLICATIONS

International Search Report, mailed Nov. 11, 2008, issued in corresponding International Application No. PCT/JP2008/064505, filed Aug. 6, 2008.

(Continued)

*Primary Examiner* — Alonzo Chambliss
(74) *Attorney, Agent, or Firm* — Christensen O'Connor Johnson Kindness PLLC

(57) ABSTRACT

In a method for producing a bonded wafer by bonding a wafer for active layer and a wafer for support layer and thinning the wafer for active layer according to the invention, oxygen ions are implanted into the wafer for active layer at a state of holding a temperature of the wafer for active layer below 200° C. under a dose of $5 \times 10^{15}$ to $5 \times 10^{16}$ atoms/cm$^2$, whereby there can be obtained a bonded wafer being excellent in the thickness uniformity after thinning and having a dramatically improved surface roughness.

2 Claims, 2 Drawing Sheets

U.S. PATENT DOCUMENTS

| | | |
|---|---|---|
| 2007/0196995 A1 | 8/2007 | Aoki |
| 2009/0075453 A1* | 3/2009 | Murakami et al. ............ 438/406 |
| 2009/0098707 A1* | 4/2009 | Nishihata et al. ............. 438/455 |
| 2009/0186464 A1* | 7/2009 | Morimoto et al. ............ 438/459 |
| 2009/0258475 A1* | 10/2009 | Endo et al. .................... 438/459 |

FOREIGN PATENT DOCUMENTS

| | | |
|---|---|---|
| JP | 5-90117 A | 4/1993 |
| JP | 7-226433 A | 8/1995 |
| JP | 7-297377 A | 11/1995 |
| JP | 2007-227424 A | 9/2007 |
| JP | 2008-16534 A | 1/2008 |
| KR | 10-2007-0053613 A | 5/2007 |
| WO | 2005/074033 A1 | 8/2005 |
| WO | 2007012290 A1 | 2/2007 |

OTHER PUBLICATIONS

Supplementary European Search Report mailed Feb. 1, 2011, issued in related European Patent Application No. 08792435.3, filed Aug. 6, 2008, 6 pages.

Notice to File a Response mailed Jun. 14, 2011, issued in related Korean Patent Application No. 10-2010-70056164, filed Aug. 6, 2008, 7 pages.

* cited by examiner (a) Conventional conditions (b) Invention

US 8,003,494 B2

METHOD FOR PRODUCING A BONDED WAFER

TECHNICAL FIELD

This invention relates to a method for producing a bonded wafer, which is intended to effectively prevent the deterioration of surface roughness and the occurrence of crystal defect particularly resulted from an oxygen ion implanted layer.

BACKGROUND ART

As a general method for producing a bonded wafer, there are known a method wherein a silicon wafer provided with an oxide film (insulating film) is bonded to another silicon wafer and one of the bonded wafers is subjected to grinding/polishing to form an SOI layer (grinding and polishing method), a method wherein oxygen ions are implanted into an inside of a silicon wafer and then annealing at a high temperature is conducted to form a buried oxide film in the inside of the silicon wafer to thereby render a top portion of the oxide film into an SOI layer (SIMOX), a method wherein hydrogen ions or the like are implanted into a surface layer portion of a silicon wafer corresponding to an SOI layer side (wafer for active layer) to form an ion implanted layer, and a silicon wafer for support substrate is bonded thereto, and then exfoliated at the ion implanted layer through a heat treatment to form an SOI layer (Smart Cut method) and the like.

Among the above methods, however, the grinding and polishing method has a problem that the thickness uniformity of the active layer is poor (not less than ±30%). Also, in the method using oxygen ion implantation (SIMOX), there is a problem that it is impossible to produce SOI structures of different crystal orientations with an insulating layer sandwiched therebetween.

In order to solve the above problems, the inventors have already developed a process combining the oxygen ion implanting method and the grinding and polishing method, namely, "A method for producing a bonded wafer by directly bonding a wafer for active layer having or not having an insulating film on its surface to a wafer for support layer and then thinning the wafer for active layer, which comprises a time-series combination of:

a step of implanting oxygen ions into the wafer for active layer to form an oxygen ion implanted layer in the active layer;

a step of subjecting the wafer for active layer to a heat treatment at a temperature of not lower than 1100° C. in a non-oxidizing atmosphere;

a step of bonding the wafer for active layer to a wafer for support layer;

a step of heat-treating for improving a bonding strength;

a step of grinding a portion of the wafer for active layer in the bonded wafer short of the oxygen ion implanted layer;

a step of further polishing or etching the wafer for active layer to expose the oxygen ion implanted layer;

a step of oxidizing the bonded wafer to form an oxide film on the exposed surface of the oxygen ion implanted layer;

a step of removing the oxide film; and a step of heat-treating at a temperature of not higher than 1100° C. in a non-oxidizing atmosphere.", which is disclosed in Patent Document 1.

According to the method disclosed in Patent Document 1, it has become possible to provide a direct bonded wafer, which is excellent in the thickness uniformity of the active layer and relatively less in the defects as evaluated with a transmission electron microscope (TEM).

Patent Document 1: JP-2006-184237

DISCLOSURE OF INVENTION

Problems to be Solved by the Invention

In the technology disclosed in Patent Document 1, however, the oxygen ion implanting conditions and the subsequent heat-treating conditions are not necessarily optimized, so that irregularity is caused at the interface between the oxygen ion implanted layer acting as a stop layer for polishing or etching and the surface layer of the final product.

In fact, when the oxygen ion implantation is conducted by one treatment with an acceleration voltage of 150 keV and a dose of $5.0 \times 10^{16}$ atoms/cm$^2$ and the heat treatment is conducted at a temperature of not lower than 1100° C. until the oxygen ion implanted layer is exposed by polishing or alkali etching according to Patent Document 1, the surface roughness (RMS value) of the resulting bonded wafer is RMS>0.6 nm [10 μm×10 μm], which is not necessarily good.

This cause is considered due to the fact that the implanted oxygen ions are reacted with silicon by the heat treatment at a high temperature to form discontinuous SiO$_2$ particles.

In order to improve the deterioration of the surface roughness due to this phenomenon, there is thought a method wherein a heat treatment after the oxygen ion implantation is conducted in an oxidizing atmosphere at a high temperature of not lower than 1300° C. for not less than 10 hours to form a continuous SiO$_2$ layer. However, in conducting such a treatment at the high temperature for the long time, there are problems that it is required to use a special furnace but also the cost rise can not be avoided due to the decrease of yield rate based on occurrence of slippage and the like.

It is, therefore, an object of the invention to advantageously solve the above problems and to provide an advantageous method for producing a bonded wafer, in which the surface roughness is effectively improved without a need for a special furnace and without the cost rise due to the decrease of yield rate.

Means for Solving Problems

In order to solve the above problems, the inventors have made various examinations particularly on ion implantation conditions and polishing or etching stop conditions in an oxygen ion implanted layer and obtained the following findings.

(1) When the oxygen ion implantation is conducted at a relatively low temperature to form a Si amorphous layer containing a greater amount of oxygen in the vicinity of a wafer surface, alkali etching stop is impossible but polishing stop is possible.

(2) In the case of the low-temperature oxygen ion implantation of the above item (1), the interface between the resulting Si amorphous layer and surface Si layer becomes drastically smooth as compared with an interface formed by the conventional implantation and heat treatment.

(3) When the wafer is held in a temperature region of not lower than 1000° C. for a long time of more than 1 hour, the Si amorphous layer is crystallized to partially change into SiO$_2$ particles, thereby the above interface becomes easily irregular. In order to avoid this phenomenon, it is advantageous that the holding time at a temperature region of not lower than 1000° C. is within 1 hour.

The invention is based on the above findings.

The summary and construction of the invention are as follows.

1. A method for producing a bonded wafer by bonding a wafer for active layer to a wafer for support layer through an insulating film or directly and then thinning the wafer for active layer, which comprises:

(1) a step of implanting oxygen ions into a wafer for active layer;

(2) a step of bonding an oxygen ion implanted side surface of the wafer for active layer to a wafer for support layer directly or through an insulating film;

(3) a step of heat-treating for enhancing a bonding strength;

(4) a step of thinning the wafer for active layer in the bonded wafer to expose the oxygen ion implanted layer;

(5) a step of removing the exposed oxygen ion implanted layer; and (6) a step of planarizing and/or thinning a surface of a portion in the wafer of active layer, wherein in the above step (1) of implanting oxygen ions into the wafer for active layer, oxygen ions are implanted at a dose of $5 \times 10^{15}$ to $5 \times 10^{16}$ atoms/cm² in a state that the temperature of the wafer for active layer is held at not higher than 200° C.

2. The method for producing a bonded wafer according to the item 1, wherein a holding time of the oxygen ion implanted layer accumulated in a temperature range of not lower than 1000° C. after the oxygen ion implantation step until the step of exposing the oxygen ion implanted layer is within 1 hour.

3. The method for producing a bonded wafer according to the item 1 or 2, wherein a surface orientation of each wafer in the bonded wafer is a combination of (100), (110) or (111).

BEST MODE FOR CARRYING OUT THE INVENTION

The invention will be concretely described below.

Figure 1:
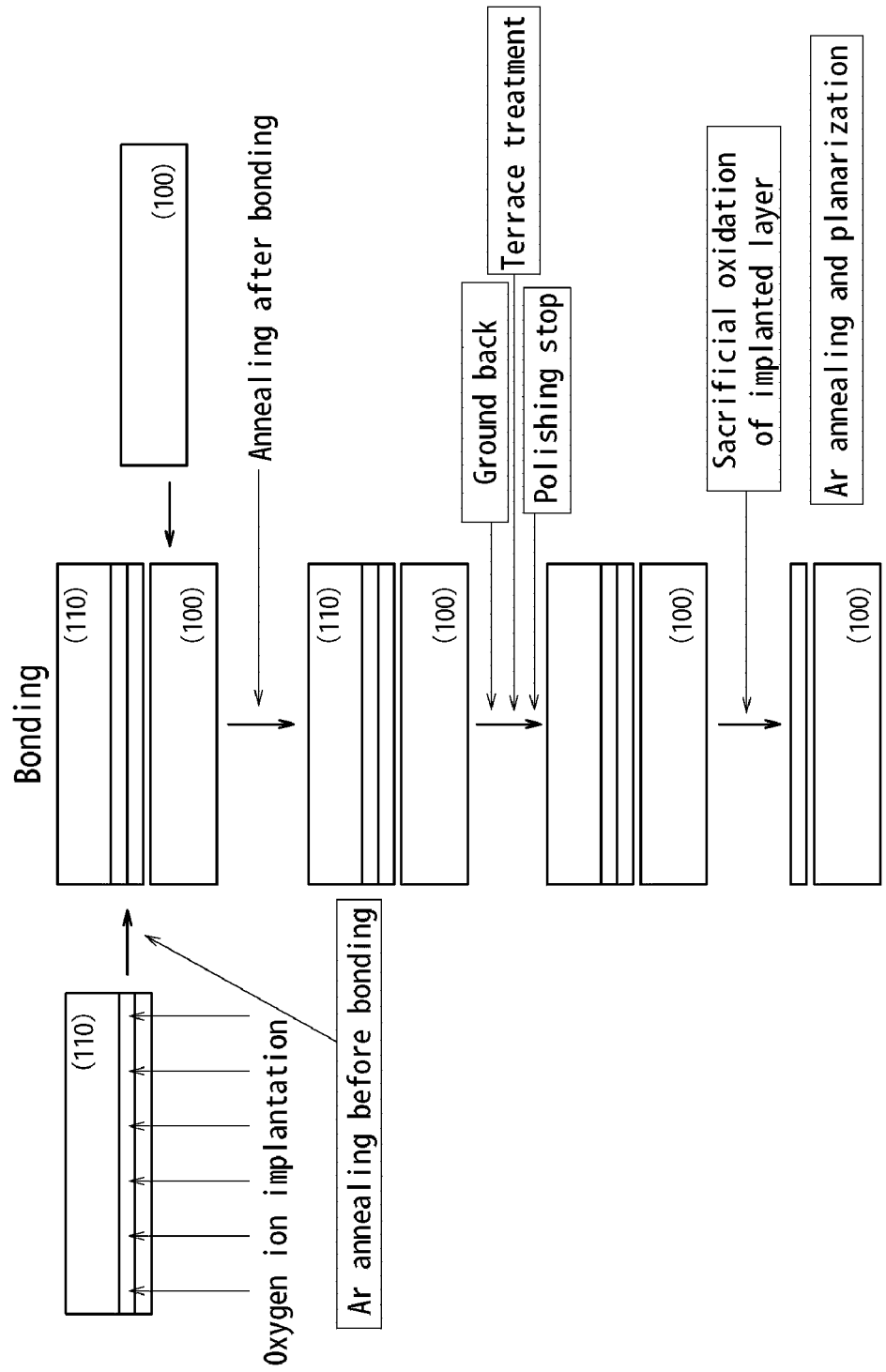
FIG. 1 is a view showing a process flow of the invention.

At first, substrates for a bonded wafer to be targeted in the invention and each production step of the invention according to the process flow shown in FIG. 1 will be concretely described.

Wafer Substrate

In the production of a bonded wafer, two silicon wafers, i.e. a wafer for active layer and a wafer for support layer are bonded to each other. The invention is applicable to not only a case of bonding the both wafers through an insulating film (oxide film) but also a case of bonding them directly without such an insulating film.

As the bonded wafer, the kind and concentration of a dopant, an oxygen concentration and the like are not limited as long as the surface roughness suitable for the bonding is good. However, a wafer with no or a few COP is preferable for further reducing the defects. At this moment, to the reduction of the COP can be applied a method of optimizing CZ pulling conditions to reduce COP, a method of subjecting a wafer to a mirror processing and then to a heat treatment at a high temperature of not lower than 1000° C. in a reduction atmosphere, a method of epitaxial growing Si on a wafer by CVD and the like.

(1) Step of Implanting Oxygen Ions into Wafer for Active Layer

In the invention, the acceleration voltage in the oxygen ion implantation can be properly selected according to the thickness of the active layer in the final product and is not particularly limited. Therefore, it may be about 100 to 300 keV, which is an acceleration voltage of a usual oxygen ion implantation machine.

The dose in the oxygen ion implantation is required to be within a range of $5 \times 10^{15}$ to $5 \times 10^{16}$ atoms/cm². When the dose in the oxygen ion implantation is less than $5 \times 10^{15}$ atoms/cm², a Si amorphous layer containing oxygen atoms is not formed sufficiently and the polishing stop can not be conducted adequately. While, when it exceeds $5 \times 10^{16}$ atoms/cm², all of the surface layer becomes amorphous and the surface active layer does not form a single crystal.

Further, the substrate temperature in the ion implantation is required to be not higher than 200° C. When it exceeds 200° C., the amorphous layer is not formed sufficiently. It is preferably not lower than room temperature (approximately 20° C.) but not higher than 100° C. Moreover, the implantation can be carried out even below the room temperature. To that end, it is necessary to add a function of forcibly cooling the wafer to the implantation machine.

The oxygen ion implantation can be divided into multiple courses, and cleaning may be conducted therebetween.

As a cleaning method are preferable cleanings with SC1, HF, $O_3$ and organic acid, which are excellent in the ability of removing particles.

In the invention, it is also preferable to conduct a heat treatment at a temperature of not higher than 1100° C. at a stage after the oxygen ion implantation and before bonding.

At this time, by heat-treating in a reducing atmosphere is diffused oxygen implanted in the vicinity of an outermost surface in the oxygen ion implantation outwardly to decrease the oxygen concentration, which contributes to suppress oxygen precipitates in the vicinity of the outermost surface in the heat treatment for enhancing the bonding strength, and hence it is possible to further reduce the defect density. As the reducing atmosphere are advantageously suitable Ar, $H_2$ and a mixed atmosphere thereof.

Figure 2:
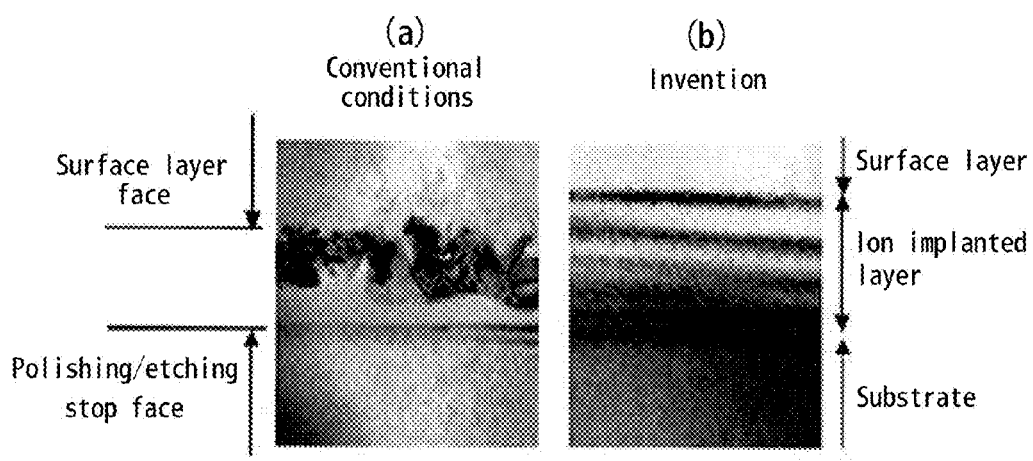
FIG. 2 is a cross-sectional TEM photograph of a wafer subjected to a heat treatment after oxygen ion implantation under (a) conventional conditions (a) and (b) conditions of the invention, respectively.

In FIGS. 2(a) and (b) are shown cross-sectional TEM photographs of wafers heat-treated after oxygen ion implantation under the conventional conditions and the conditions of the invention and before bonding by comparison.

Moreover, the oxygen ion implantation conditions and the heat treatment conditions are as follows, respectively.

Conventional Conditions
Oxygen Ion Implantation Treatment
Acceleration voltage: 200 keV, dose: $2 \times 10^{17}$ atoms/cm², substrate temperature: 450° C.
Heat Treatment
1200° C., 2 hours
Conditions of the Invention
Oxygen Ion Implantation Treatment
Acceleration voltage: 200 keV, dose: $2 \times 10^{16}$ atoms/cm², substrate temperature: room temperature
Heat Treatment
1000° C., 1 hour As seen from this figure, a continuous $SiO_2$ layer is observed under the conventional conditions and the occurrence of irregularity is unavoidable at the interface between the surface layer and the ion implanted layer corresponding to the surface of the surface layer after bonding.

On the contrary, a clear $SiO_2$ layer is not observed under the conditions of the invention and the interface between the ion implanted layer and the surface layer is smooth.

(2) Step of Bonding Wafer for Active Layer to Wafer for Support Layer

Next, the wafer for active layer and the wafer for support layer are bonded to each other. In this bonding, both wafers may be bonded through an insulating film or directly without an insulating film.

In case of bonding through the insulating film, an oxide film ($SiO_2$), a nitride film ($Si_3N_4$) and the like are preferable as the insulating film. Also, as a film forming method are preferable a heat treatment in an oxidizing atmosphere or a nitrogen atmosphere (thermal oxidation, thermal nitriding), CVD and the like. As the thermal oxidation may be used wet oxidation using steam in addition to oxygen gas, and so on.

Furthermore, the insulating film may be formed on the surface-side substrate before oxygen ion implantation or after implantation. However, in case of forming the film after the implantation, it is required to form a film at a temperature of not higher than 1000° C., which hardly proceeds crystallization of amorphous.

Moreover, the insulating film can be formed on the wafer for active layer or the wafer for support layer or both wafers for active layer and support layer.

Before the bonding, it is advantageous to conduct a cleaning treatment for suppressing the occurrence of voids due to particles.

As the cleaning method is effective a general method of cleaning a silicon wafer such as SC1+SC2, HF+$O_3$, an organic acid or a combination thereof.

Moreover, the bonding strength is not sufficient at the bonding temperature of not higher than 1000° C. and there may be feared a risk of causing separation depending on conditions (pressure and speed) at the grinding/polishing step after the bonding. In this case, it is advantageous that the silicon surface before bonding is subjected to an activation treatment through plasma using oxygen, nitrogen, He, $H_2$, Ar or a mixed atmosphere thereof for enhancing the bonding strength.

In case of direct bonding, $H_2$ adsorbed to the bonded surface is changed into $SiO_2$ by the subsequent heat treatment to exist in the bonded interface, so that there may be conducted a method wherein the bonded surfaces are cleaned with HF and hydrophobic surfaces are bonded to suppress $SiO_2$. Thus, oxides in the interface can be reduced to improve device property.

(3) Step of Heat-Treating for Enhancing Bonding Strength

The heat treatment for enhancing the bonding strength is conducted at a temperature of not lower than 1000° C. for increasing the bonding strength sufficiently, but the holding time is preferable to be within 1 hour. The atmosphere is not particularly limited, but it is preferable to be an oxidizing atmosphere for forming an oxide film of not less than 150 nm in order to protect the back surface of the wafer at the subsequent grinding step.

(4) Step of Thinning Wafer for Active Layer to Expose Oxygen Ion Implanted Layer Grinding The grinding of the wafer for active layer in the bonded wafer is carried out by machining. In this grinding, a part of the wafer for active layer is left on the front surface side of the oxygen ion implanted layer. The thickness of the remaining part of the wafer for active layer is not limited.

In order to shorten a time for subsequent polishing step, it is preferable to conduct the grinding until just before the oxygen ion implanted layer. The thickness of the remaining Si film is preferable to be about 3 to 10 μm considering the accuracy of the grinding apparatus and the grinding damage depth (approximately 2 μm).

Polishing

Continuously, the wafer for active layer is further polished to expose the oxygen ion implanted layer.

This polishing method (polishing stop) is preferable to be conducted while supplying a polishing agent having an abrasive concentration of not more than 1 mass %. As the polishing solution is mentioned an alkaline solution having an abrasive (e.g., silica) concentration of not more than 1 mass %. As the alkaline solution is preferable an inorganic alkaline solution (KOH, NaOH, etc.), an organic alkaline solution (e.g., piperazine, ethylendiamine and the like which contain an amine as an essential component) or a mixed solution thereof.

In this polishing method, since the abrasive concentration is not more than 1 mass %, the mechanical polishing action with the abrasive is very few, and the chemical polishing action is preferential. A part (Si layer) of the wafer for active layer is polished by the chemical polishing action with the alkaline solution. Since the alkaline solution is high in the etching rate ratio of Si/(Si amorphous layer containing oxygen atoms), the Si layer as a part of the wafer for active layer can be polished effectively, whereas the Si amorphous layer containing oxygen atoms is hardly polished. Therefore, even when the mechanical accuracy of the polishing apparatus is not sufficient, the oxygen ion implanted layer is hardly polished and only the Si layer is polished, and hence the oxygen ion implanted layer can be exposed uniformly.

Particularly, by etching Si before polishing is made smooth the boundary between a terrace (an outermost peripheral region of 1-3 mm where two wafers are not bonded to each other) and the bonding region to suppress the occurrence of particles. Moreover, only the terrace portion may be polished before the polishing.

At this moment, when a heat treatment is conducted over a period from the step (1) of implanting oxygen ions into the wafer for active layer to the step (4) of exposing the oxygen ion implanted layer by the polishing, it is preferable that a holding time accumulated in a temperature range of not lower than 1000° C. is within 1 hour. When the holding time in the temperature region of not lower than 1000° C. exceeds 1 hour, there is a fear of recrystallizing the Si amorphous containing oxygen atoms formed in the oxygen ion implantation.

Moreover, the treating time is not particularly limited as long as the treating temperature in the above heat treatment is not higher than 1000° C.

(5) Step of Removing Oxygen Ion Implanted Layer

The exposed oxygen ion implanted layer is composed of Si amorphous containing oxygen atoms, partially recrystallized Si and $SiO_2$. As a removal method can be applied an etching method, an oxidizing and etching method, polishing and the like.

Etching Method

Since the oxygen ion implanted layer selects conditions that the oxygen dose and the heat treatment for providing the complete $SiO_2$ layer are not sufficient, it is preferable as an etching condition that the etching is conducted with a HF solution removing $SiO_2$, or an alkali solution removing Si or an alternating use of SC1 solution or ozone solution oxidizing Si and HF solution removing $SiO_2$ formed by oxidization.

In any case, the HF solution is used and the wafer is immersed in the HF solution, and thereafter it is preferable to repeatedly conduct oxidization and HF until the entire surface of the wafer becomes a water-repellant surface as a measure for $SiO_2$ removal.

Oxidation Method

This method comprises a step of forming an oxide film of a predetermined thickness on the exposed surface of the oxygen ion implanted layer and a step of removing the resulting oxide film.

The oxidation treatment is sufficient to be conducted in an oxidizing atmosphere and the treating temperature is not particularly limited, but an oxidizing atmosphere of 600 to 1000° C. is preferable.

However, in order to suppress the deterioration of the surface roughness resulted from $SiO_2$ particles, which are generated by recrystallization of amorphous in the oxygen ion implanted layer, it is preferable to treat the layer at a low temperature, and 600 to 900° C. is more preferable.

When the oxidation treatment is conducted at the low temperature, wet oxidation using $H_2O$ steam and hydrochloric acid oxidation through an oxidizing gas treatment containing HCl gas can be applied for increasing the growing rate of the oxide film, which is more preferable for obtaining a high throughput.

The thickness of the oxide film is not particularly limited, but when a crystal defect layer exists in the oxygen ion implanted layer, the thickness is preferable to be not less than the thickness of the defect layer, and also it is preferably about 100 to 500 nm in the oxygen ion implantation conditions of the invention. When the thickness of the oxide film is less than 100 nm, the Si amorphous layer cannot be removed sufficiently under the oxygen ion implantation conditions of the invention, while when it exceeds 500 nm, the thickness uniformity of the active layer is deteriorated due to the disruption of the in-plane uniformity of the oxide film.

The oxide film may be removed by cleaning with the HF solution or by etching through annealing with hydrogen gas, Ar gas or gas containing HF. Here, the oxidation treatment and removal treatment may be conducted plural times. Thus, it is possible to more thin the active layer while maintaining the planarized surface roughness.

It is advantageous to remove particles and metal impurities attached to the surface of the bonded wafer by immersing the bonded wafer in a mixed solution of an organic acid and hydrofluoric acid, for example, after the removal of the oxide film.

(6) Step of Planarizing/Thinning Surface of Wafer for Active Layer

The surface of the bonded wafer after the removal of the oxygen ion implanted layer is rough as compared to mirror polishing and is necessary to be planarized.

As a planarization method can be applied a heat treatment in a reducing atmosphere, a polishing, a gas etching comprised of gas/ion/radical capable of Si etching and so on.

Polishing Method

The bonded surface is polished very slightly to improve the roughness. The polishing margin is preferable to be about 10 to 500 nm. When it is less than 10 nm, the roughness cannot be improved sufficiently, while when it exceeds 500 nm, the thickness uniformity of the active layer is deteriorated. By this treatment, it is possible to make the surface roughness (RMS) to not more than 0.5 nm.

Heat Treatment in Reducing Atmosphere

The heat treatment is conducted in Ar, $H_2$ or a mixed atmosphere thereof to improve the surface roughness of the bonded wafer. The treating temperature is preferably about not lower than 1000° C. but not higher than 1300° C. The treating time needs to be longer for the lower temperature and is preferable to be about 1 to 2 hours at 1000 to 1200° C., about 10 to 30 minutes at 1200 to 1250° C., and about 1 to 5 minutes at not lower than 1250° C. If the heat treatment is conducted at a higher temperature for a longer time beyond the above temperature and time, there is a fear of deteriorating the in-plane uniformity of the active layer by the etching action of the reducing atmosphere.

In the invention, since the heat treatment after the bonding until the removal of the oxygen ion implanted layer is limited to have the holding time accumulated in the temperature region of not less than 1000° C. within 1 hour, the sufficient bonding strength is not necessarily obtained. Therefore, it is more preferable to conduct the planarization treatment at a temperature of not lower than 1100° C. for improving the bonding strength after the removal of the oxygen ion implanted layer.

If surface activation with plasma or the like is conducted as a treatment before bonding, the heat treatment of not lower than 1100° C. is not necessarily required.

As a heat-treating furnace are preferable a resistance heating type vertical furnace capable of simultaneously treating plural wafers, a lamp heating type RTA (rapid thermal annealing furnace) of treating wafer by wafer, and so on. Particularly, RTA is effective for treatment at not lower than 1200° C.

By the above heat treatment, it is possible to render the surface roughness (RMS) into not more than 0.5 nm likewise the case of polishing method.

The surface oxide film generated by this heat treatment may be removed by cleaning with HF solution or by etching through annealing with hydrogen gas, Ar gas or gas containing HF.

Thus, it is possible to obtain a bonded wafer being excellent in the thickness uniformity and less in the defects and having a dramatically improved surface roughness.

According to the invention, it is also possible to produce a bonded wafer, wherein silicon wafers having different crystal orientations are directly bonded to each other (e.g., bonding of 110 crystal and 100 crystal, bonding of 111 crystal and 100 crystal, etc.).

EXAMPLES

Example 1

Two silicon wafers having a diameter of 300 mm are provided by slicing from a boron-doped silicon ingot grown by CZ method. Among them, one silicon wafer has a crystal orientation of (100) and is a wafer for active layer, and the other silicon wafer has a crystal orientation of (110) and is a wafer for support layer.

The (100) wafer is treated in an oxidizing atmosphere at 1000° C. for 3 hours to form an oxide film with a thickness of 150 nm.

Next, the surface of the (100) wafer as a wafer for active layer is subjected to an oxygen ion implantation at an acceleration voltage of 200 keV. In this case, the substrate temperature is from room temperature to less than 200° C., and the dose is varied within a range of $1 \times 10^{15}$ to $1 \times 10^{17}$ atoms/$cm^2$.

As a result, an oxygen ion implanted layer is formed in a depth position of about 450 nm from the surface of the wafer for active layer.

Then, both the wafers are subjected to HF+ozone cleaning to remove particles on the surfaces to be bonded, and thereafter both the wafers are bonded.

Subsequently, the heat treatment for bonding is conducted for firmly bonding the bonded interface. The heat-treating conditions are an oxidizing atmosphere, 950° C. and 1 hour, and oxide films with a thickness of approximately 150 nm are formed on the front and back surfaces of the bonded wafer as a back surface protection film at the subsequent processing.

Then, the wafer for active layer in the bonded wafer is ground by a predetermined thickness from its surface with a grinding apparatus. That is, the grinding treatment is conducted so as to leave only a part of the wafer for active layer (a thickness of about 5 μm) on the front surface side of the oxygen ion implanted layer.

Next, the surface of the bonded wafer after the grinding is polished by supplying a polishing agent containing abrasives with an abrasive (silica) concentration of not more than 1 mass % to expose the oxygen ion implanted layer. As the polishing agent is used an alkaline solution having an abrasive concentration of not more than 1 mass %. This alkaline solution is an organic alkaline solution containing amine (e.g., piperazine, ethylenediamine or the like) as a main component.

Moreover, the thus obtained oxygen ion implanted layer is formed uniformly in the plane of the bonded wafer, and consequently it is confirmed that the oxygen ion implanted layer uniformly formed in the plane is exposed.

Thereafter, the bonded wafer is subjected to wet oxidation treatment in an oxidizing atmosphere at a temperature of 950° C. for 0.5 hour. As a result, an oxide film of a given thickness is formed on the exposed surface of the oxygen ion implanted layer in which all of Si amorphous layer containing oxygen atoms is converted into an oxide film ($SiO_2$). Next, the oxide film is removed by HF etching (HF solution composition: 10%, temperature: 20° C.). After the removal of the oxide film, the thickness of the exposed active layer is uniformized in the plane and thinned.

Then, the bonded wafer is cleaned by the following treatment. It is immersed in an aqueous solution of dissolved ozone having an ozone concentration of 5 ppm, an aqueous solution of 0.06 mass % of citric acid as an organic acid in pure water, an aqueous solution of 0.05 mass % of hydrofluoric acid, an aqueous solution of 0.6 mass % of citric acid as an organic acid in pure water, and lastly an aqueous solution of dissolved ozone having an ozone concentration of 5 ppm at room temperature in this order. The treating time is 5 minutes and the treating temperature is room temperature, respectively. By this cleaning treatment are removed metal impurities and particles from the surface of the bonded wafer.

After the cleaning, the bonded wafer is finished by subjecting to a heat treatment in an argon gas atmosphere at 1100° C. for 2 hours.

The thickness of the thus obtained active layer is 100 to 200 nm and the scattering of the thickness distribution in the plane is within 10 to 20%.

Example 2

A bonded wafer is prepared under the same conditions as in Example 1 except that a (100) wafer for active layer and a (110) wafer for support layer are bonded without an insulating film (oxide film).

The thickness of the thus obtained active layer is 250 to 350 nm and the scattering of the thickness distribution in the plane is within 10 to 20%.

Next, the surface roughness of each of the bonded wafers obtained in Examples 1 and 2 is examined. The measurement apparatus is AFM and the evaluation field is 10×10 μm.

Figure 3:
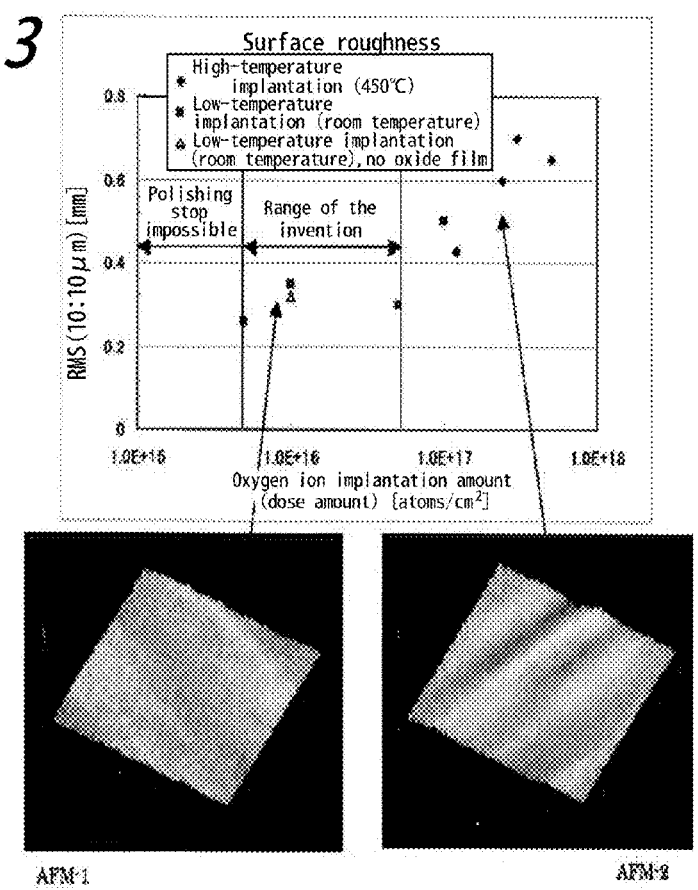
FIG. 3 is a view showing surface roughness of a bonded wafer produced under various ion implantation conditions.

The obtained results are shown in FIG. 3. In addition, the examination results when oxygen ion implantation is conducted under high temperature and high dose conditions according to the conventional method with substrate temperature of 450° C. and dose of $2 \times 10^{17}$ atoms/cm$^2$ are also shown in FIG. 3 for comparison.

As seen from this figure, when the oxygen ion implantation is conducted at a high temperature and a high dose as in the conventional technique, only the surface roughness (RMS) of more than 0.4 nm is obtained, while when the implantation is carried out according to the invention, a good surface roughness (RMS) of less than 0.4 nm could be obtained regardless of the presence or absence of the oxide film.

INDUSTRIAL APPLICABILITY

According to the invention, it is possible to stably obtain a bonded wafer, which is excellent in the thickness uniformity after thinning and extremely less in the occurrence of defects and dramatically improves the surface roughness.

The invention claimed is:

1. A method for producing a bonded wafer by bonding a wafer for active layer to a wafer for support layer through an insulating film or directly and then thinning the wafer for active layer, which comprises:
    (1) a step of implanting oxygen ions into a wafer for active layer;
    (2) a step of bonding an oxygen ion implanted side surface of the wafer for active layer to a wafer for support layer directly or through an insulating film;
    (3) a step of heat-treating for enhancing a bonding strength;
    (4) a step of thinning the wafer for active layer in the bonded wafer to expose the oxygen ion implanted layer;
    (5) a step of removing the exposed oxygen ion implanted layer; and
    (6) a step of planarizing and/or thinning a surface of a portion in the wafer of active layer,
wherein in the above step (1) of implanting oxygen ions into the wafer for active layer, oxygen ions are implanted at a dose of $5 \times 10^{15}$ to $5 \times 10^{16}$ atoms/cm$^2$ in a state that the temperature of the wafer for active layer is held at not higher than 200° C., and wherein a holding time of the oxygen ion implanted layer accumulated in a temperature range of not lower than 1000° C. after the oxygen ion implantation step until the step of exposing the oxygen ion implanted layer is within 1 hour.

2. The method for producing a bonded wafer according to claim 1, wherein a surface orientation of each wafer in the bonded wafer is a combination of (100), (110) or (111).

* * * * *